US004001762B2

United States Statutory Invention Registration [19]

[11] Reg. Number: H1762

Kaempf et al.

[45] Published: Dec. 1, 1998

[54] WAFER RESTRAINING SYSTEM

[76] Inventors: Ulrich Kaempf, 1741 Spyglass Dr., #304, Austin, Tex. 78746; Rick Scott, 7309 Dixie Dr., Austin, Tex. 78744

[21] Appl. No.: 803,334

[22] Filed: Feb. 21, 1997

Related U.S. Application Data

[63] Continuation of Ser. No. 548,426, Oct. 26, 1995, abandoned.

[51] Int. Cl.[6] ..... B65D 81/02

[52] U.S. Cl. ..... 206/710

[58] Field of Search ..... 206/521–524, 206/591–594, 710–712, 454

[56] References Cited

U.S. PATENT DOCUMENTS

| | | | |
|---|---|---|---|
| 3,733,005 | 5/1973 | Frieder, Jr. | 206/522 |
| 3,964,608 | 6/1976 | Rowley | 206/522 |
| 4,557,382 | 12/1985 | Johnson | 206/711 |
| 4,597,244 | 7/1986 | Pharo | 206/522 |
| 4,739,882 | 4/1988 | Parikh et al. | 206/711 |
| 4,793,123 | 12/1988 | Pharo | 206/522 |
| 4,815,912 | 3/1989 | Maney et al. | 414/217 |
| 5,097,421 | 3/1992 | Maney et al. | 364/478 |
| 5,228,568 | 7/1993 | Ogino et al. | 206/711 |
| 5,370,491 | 12/1994 | Bonora et al. | 414/217 |

FOREIGN PATENT DOCUMENTS

| | | | |
|---|---|---|---|
| 3827858 | 3/1989 | Germany | 206/522 |

*Primary Examiner*—Charles T. Jordan
*Assistant Examiner*—Meena Chelliah

[57] ABSTRACT

Disclosed is an apparatus and method for restraining flat objects such as semiconductor wafers within a cassette placed inside a box or pod to prevent movement or vibration of the flat objects during storage or transport. A flexible or inflatable tube contacts and conforms to the edge of the objects to eliminate movement and provide vibrational damping without hard surface contact or damage. The tube may be deflated or removed from contact with the wafers to allow removal of the wafers from the cassette.

21 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

WAFER RESTRAINING SYSTEM

This application is a continuation of application Ser. No. 08/548,426, filed Oct. 26, 1995, abandoned on Feb. 20, 1997.

BACKGROUND OF THE INVENTION

1. Field of the Invention

The present invention relates generally to the field of the manufacturing and movement of particulate contamination sensitive articles such as semiconductor wafers, flat panel displays, disks, and more particularly to semiconductor wafer carriers.

2. Description of the Related Art

The manufacture of articles, such as semiconductor wafers, which increasingly require geometries on a sub-micron scale is extremely sensitive to the presence of particulate contamination in the environment during fabrication. For this reason, an important aspect of the semiconductor wafer manufacturing process is a controlled, particle-free environment. One attempt to address the problem of particulate contamination is the standardized mechanical interface (SMIF) system described in U.S. Pat. Nos. 4,532,970 and 4,534,389. The SMIF system comprises an enclosed pod for storing and transporting cassettes containing wafers and canopies placed over the load port of the manufacturing equipment. The pod consists of a door that interfaces with the port door on the manufacturing equipment canopy for the transfer of the wafer carrying cassette from the pod to the inside of the canopy. Thus, wafers are contained at all times in miniature clean spaces within which control of particulate levels is facilitated.

Typically, wafers are transported without retention, in a stacked configuration in a cassette. The wafers are loosely held in single slots, one for each wafer, for ease in mechanical insertion and removal of the wafers. During the transport of semiconductor wafers in the cassettes and carrying boxes or pods, wafers are subjected to vibration and shock movements within the slots of the cassette. In addition, carrying boxes are subjected to external vibration which transmits to the wafers. The movement of the wafers within the cassettes causes damage to wafers and the generation of particles. Particle contamination creates circuit defects and losses of yield during subsequent fabrication. For this reason, it is important to eliminate wafer movement within the cassette during material transport.

Some suppliers of boxes use a mechanical bar mounted inside the box which pushes against the edge of the wafers to retain them in the slots of a cassette. However, this method requires a mechanism to activate the retaining bar during loading and unloading the cassette into and from the box. In addition, it has been found that friction between the retaining bar and the wafer tends to cause edge damage and create particulate contaminants. It has also been found that another disadvantage of this method arises from the rigidity of the bar, in that because of small variations in wafer diameters or dimensional variations of the cassette, only a few wafers are typically in contact with the retaining bar. Wafers that are not touching the bar remain unrestrained and are free to move, especially in the direction perpendicular to the wafer surface.

There is still a need therefore, for a method of restraining semiconductor wafers within the slots of a cassette such that all the wafers are immobilized without creating any edge damage or additional particles.

SUMMARY OF THE INVENTION

The present invention seeks to address these and other drawbacks inherent in the prior art by retaining the wafers in the cassette slots and providing passive vibration damping using the principle of a pneumatic spring. To retain wafers within the slots of the cassette, in one preferred embodiment the invention provides a flexible, pliant or inflatable tube, installed inside the pod or box, perpendicular to the surface of the wafers. When inflated, the tube applies a pressure to the edge of the wafers, forcing them firmly against the rims of the slot (FIG. 1, FIG. 1A). Due to the conformance of the material of the tube, each wafer is in contact with the tube. This constrains the wafers from moving parallel to their surface. Because of the flexibility of the tube, a small bulge forms around the wafer's edge. This bulge restricts wafers from movements perpendicular to their surfaces. In the deflated state, the tube collapses and retreats from the wafer's edges to provide a clearance for removal and insertion of the wafers from and into the pod (FIG. 2, FIG. 2A). Inflation and deflation can be actuated by means of a valve stem that protracts from the tube through the wall of the pod. This allows for the external application of pressured air, or alternatively of vacuum, whenever the cassette needs to be loaded into or unloaded from the pod.

More particularly, semiconductor wafers and the like are held in slotted members within a container in which an elastically deformable or plaint member cushions the wafers from shock and vibration. When the wafers are in position in such a container, the elastically deformable member engages and conforms to the edges of the wafers. The wafers are thereby stabilized and restrained from movements which could otherwise contaminate the wafers.

The slotted members hold the wafers side-by-side in lateral or vertical arrays with edges of the wafers protruding from the slots. A member of currently available cassettes, trays, etc. may be used or modified for use as such slotted members.

The pods, boxes or containers employed to hold the slotted members typically are hexahedrons with six sides or surfaces and have an opening in one such surface to receive wafers. In accordance with the invention, the container is sized to form a space between the protruding edges of the wafers and the surface of the container which is positioned opposite the wafers. The surface may be the cover which is used to close the opening to the container.

An elastically deformable member is interposed between the edges of the wafers and the opposing surface of the container. The member is supported by the container and extends along the array of wafers. When the member is supported by the cover, it may be a relatively soft elastomeric member which presses against and conforms to the wafers. The member is preferably an inflatable elastomeric tube, bellows, bladder or the other member which upon inflation expands within the space to contact and conform to the wafers. A conduit preferably penetrates the box and connects the interior of the inflatable member to a pressure source external of the box. A valve in the conduit controls the flow of fluid through the conduit. The conduit may similarly connect the elastomeric tube to a vacuum source.

This method and apparatus of the invention may be applied to items other than wafers, as for instance magnetic discs, flat panel display substrates, etc., which are also manufactured by a process that requires substrates to be transported in a clean environment. Also, in cases where the pod door is perpendicular to the wafer surface, a permanently inflated tube or flexible tube can be mounted to the door. In this case, the tube is engaged or disengaged with the wafers as the door is closed or opened (FIG. 3A, FIG. 3B). Alternatively, the tube may be attached to the box door as illustrated in FIG. 4, with the valve stem extended through the door. This embodiment may be particularly applicable to boxes (pods) using the SMIF configuration.

In an alternate embodiment, instead of pressurizing an inflatable tube to lock wafers into place, the tube may be constructed such that its inflated state occurs under atmospheric pressure. To retract and collapse the tube, vacuum may be applied. This embodiment is contemplated to be better suited for facilities where vacuum lines are more commonly available that the supply of pressurized air.

DETAILED DESCRIPTION OF THE PREFERRED EMBODIMENTS

Figure 1:
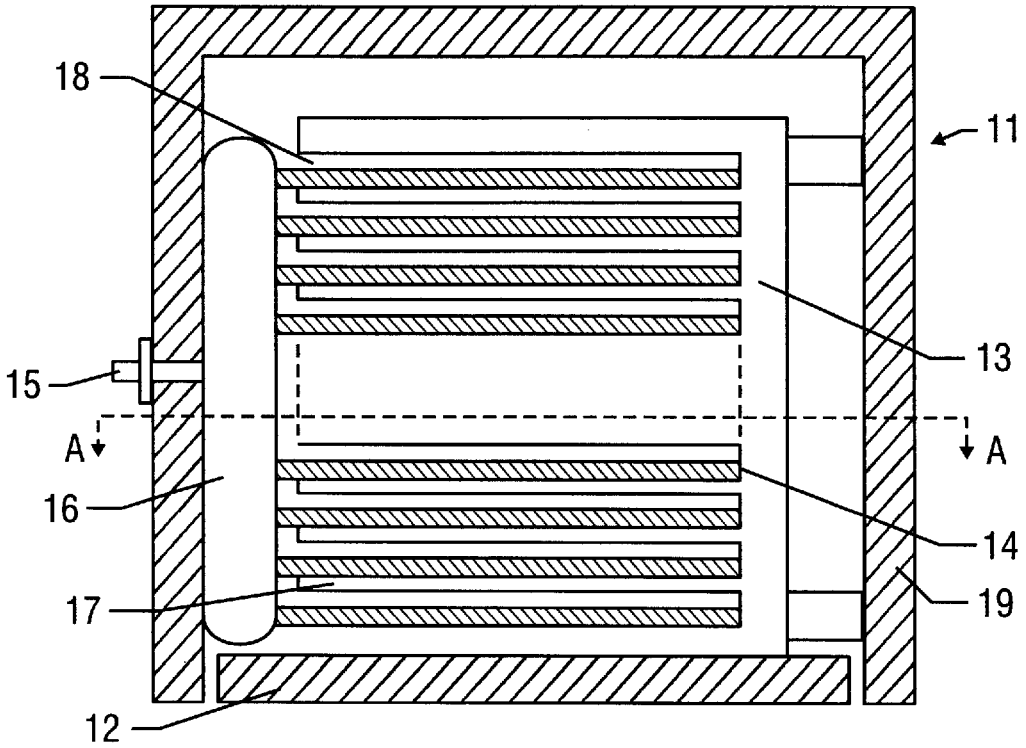
FIG. 1. Side view of an apparatus with a tube inflated to contact semiconductor wafers, as applied to a pod with a bottom door.

FIG. 1 demonstrates a system for containing a parallel, stacked arrangement of a plurality of semiconductor wafers 14 in a cassette 13, and in which the cassette 13 is contained with a pod 11. Pod 11 may be a pod such as used in a SMIF system or alternatively any other box or container used for transporting wafers. The pod 11 has a removable door 12 and contains one cassette 13. Through not shown, the door 12 may be secured by retractable latches or other means known in the art. In alternate embodiments (not shown), the door 12 may be connected to the pod 11 by one or more hinges to swingably open or close. In FIG. 1, there is an inflatable retainer tube 16 attached to a wall 19 of the pod 11. A valve 15 extends from the exterior through the wall 19 of the pod 11 and connects with the interior cavity 21 of the inflatable tube 16 or bladder and is operable such that the valve 15 may be connected to a source of compressed air or other means of inflating the tube 16, or alternatively, the valve 15 may be connected to a vacuum source in order to deflate the tube. In practice, the valve 15 may also be opened to equalize any pressure difference between the area surrounding the pod 11 and the tube 16, thus deflating or inflating the tube 16 as the case may be.

The cassette 13 is designed to hold a plurality of wafers 14 in a parallel, stacked arrangement. Three sides of the cassette 13 contain ridges 17 or projections that define three-sided slots 18, tracks, ridges or grooves for holding the wafers 14 where one side of the cassette 13 is open, with the wafers 14 typically extending past the open side of the cassette 13. The wafers 14 are loosely contained in the slots 18 for ease in mechanical insertion and removal of the wafers 14 into or from the cassette 13 and one edge of the wafers 14 is exposed. This arrangement allows for freedom of movement both parallel and perpendicular to the plane of the stacked wafers.

In the embodiment shown in FIG. 1, the wafers are held firmly in the slots by contact with the inflated tube 16 along the edge of the wafers 14 at the open end of the cassette 13. When the tube 16 is in the inflated state, as in the embodiment shown in FIG. 1, the tube 16 is pressed against the wafers 14, thus pressing the wafers 14 firmly against the slot 18 such that movement of the wafers 14 in a direction parallel to the plane of the wafer 14 is restricted. In addition, due to the flexibility of the tube 16, as the tube 16 is pressed against the edges of the wafers 14, the tube 16 becomes deformed to form bulges around the exposed edges of the wafers 14 thus damping any movement or vibration in a direction perpendicular to the plane of the wafers 14. In addition, the flexibility of the tube 16 allows the tube 16 to contact all the wafers 14, even in the case of unevenness of the edges.

Figure 1A:
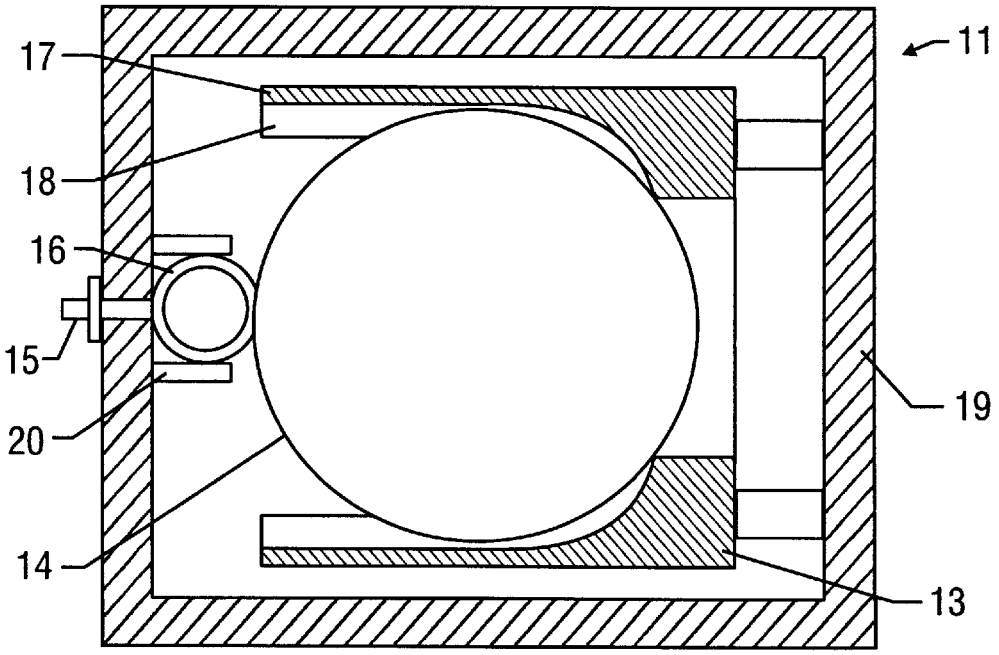
FIG. 1A. Sectional view of FIG. 1 at section line A—A, as applied to a pod with a bottom door.

FIG. 1A is a cross-section view of FIG. 1 at section line A—A. This view shows a wafer 14 held loosely in the slot 18 on three sides, and contacting the tube 16 on the exposed edge of the wafer 14. The tube 16 is shown in this embodiment to be attached to the wall 19 of the pod 11 by means of a bracket 20. The tube 16 may also be attached by other means such as by an adhesive, for example.

Figure 2:
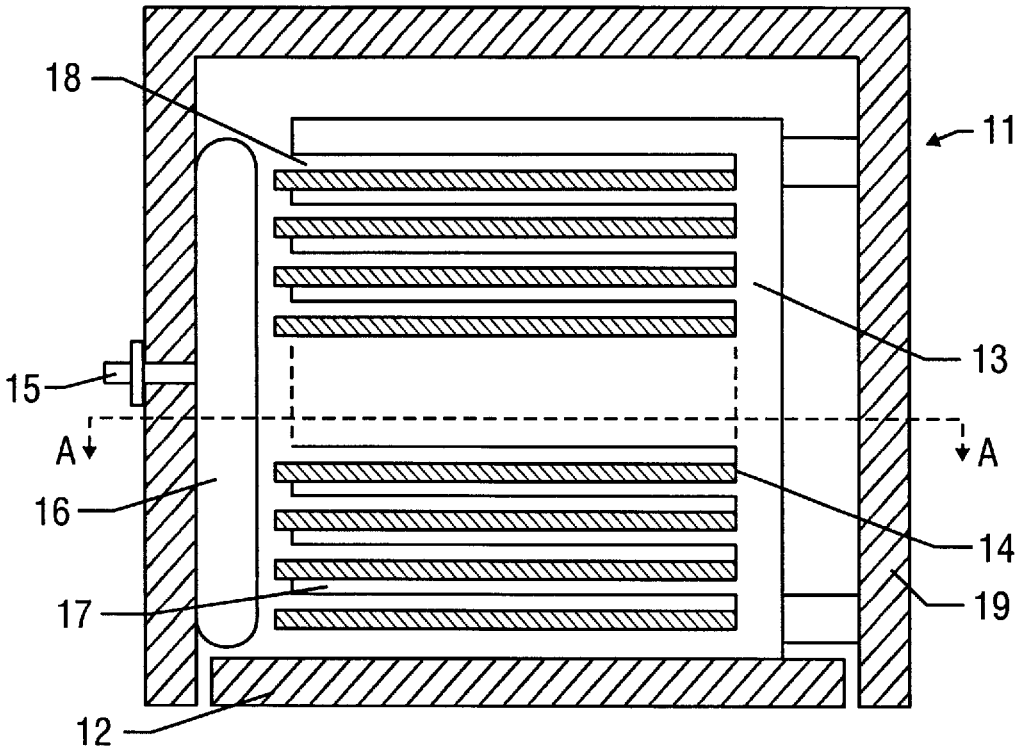
FIG. 2. Side view of an apparatus with a tube deflated and not in contact with semiconductor wafers, as applied to a pod with a bottom door.
Figure 2A:
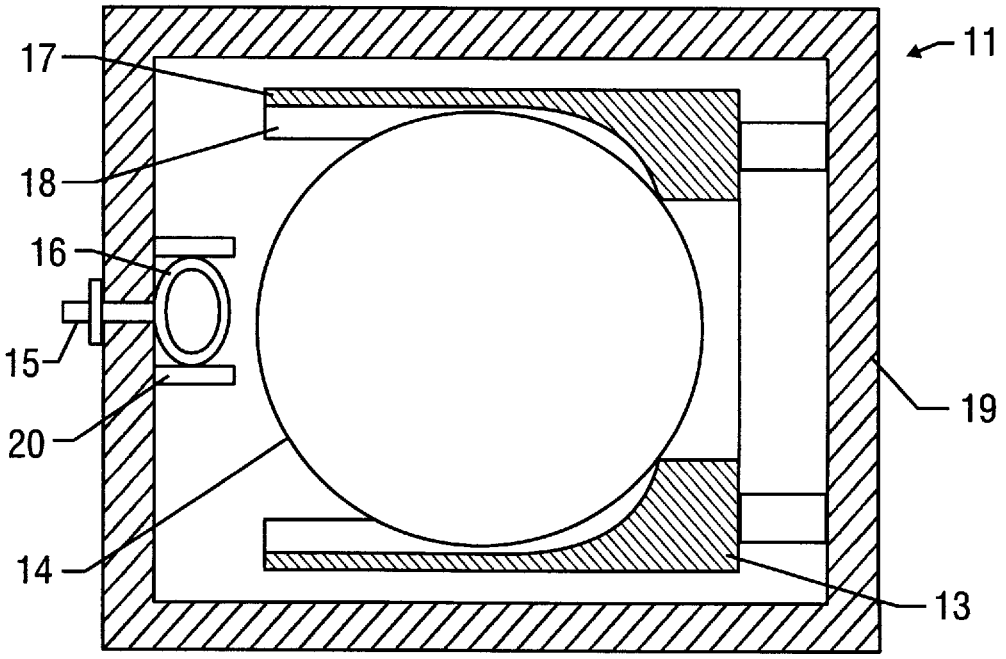
FIG. 2A. Sectional view of FIG. 2 at section line A—A, as applied to a pod with a bottom door.

FIG. 2 depicts the apparatus of FIG. 1 with the inflatable tube 16 in the deflated state. In this state, the tube 16 has retreated from the edge of the wafers 14 and does not maintain contact with the wafers 14 held in the cassette 13. When the tube 16 is in the deflated state, the cassette 13 may be removed from the pod 11 without interference from the tube 16. FIG. 2A is a cross-section at A—A of the embodiment shown in FIG. 2. The tube 16 is shown with the interior cavity 21 in a low pressure state relative to the outside environment.

Figure 3A:
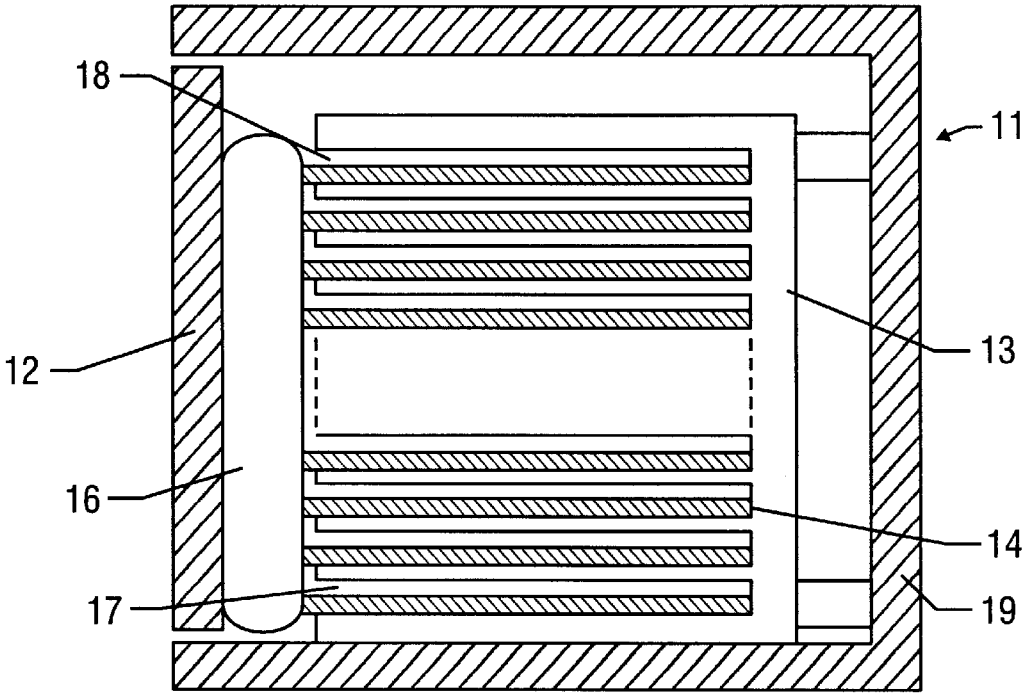
FIG. 3A. An apparatus with a flexible tube attached to a pod door in closed position, as applied to a pod with side door opening.

In the embodiment shown in FIG. 3A, the tube 16 is a flexible tube or, alteratively, a permanently inflated tube which is attached to the interior surface of the pod door 12. The door 12 is positioned in the side of the pod 11 facing the open side of the cassettes 13. In this embodiment, when the door 12 is closed, the tube 16 is pressed firmly against the edge of the wafers 14 to hold the wafers 14 firmly in the slots and the tube is deformed around each wafer to provide vibrational damping in a direction perpendicular to the plane of the wafers 14. The tube 16 may be a permanently inflated bladder, hollow tube or the like, constructed of an expandable elastomeric material such as rubber, or latex, for example, or the tube 16 may alternatively be constructed of a flexible material such as an elastomeric, plastic or foam polymer that has the quality of being deformable and resilient in order to conform to and deform around the edges of the wafers and to return to its original shape when removed from the wafers 14. Examples of such materials include, but are not limited to rubber, latex or any other elastic tubing.

Figure 3B:
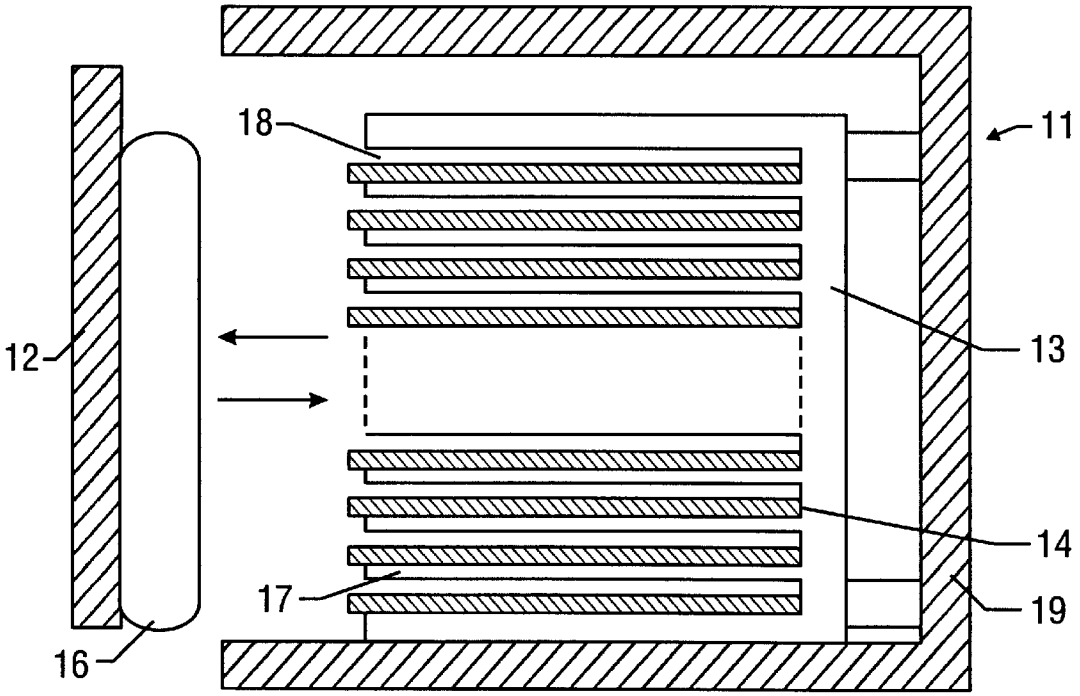
FIG. 3B. An apparatus with a flexible tube attached to a pod door in open position, as applied to a pod with a side door.

FIG. 3B demonstrates the embodiment shown in FIG. 3A with the door 12 in the open position. When the door 12 is removed form the pod 11, the tube 16 no longer contacts the wafers 14. The cassette 13 is then easily removed from the box or pod 11. The attached tube 16 is removed from contact with the wafers 14 when the door 12 is open.

Figure 4:
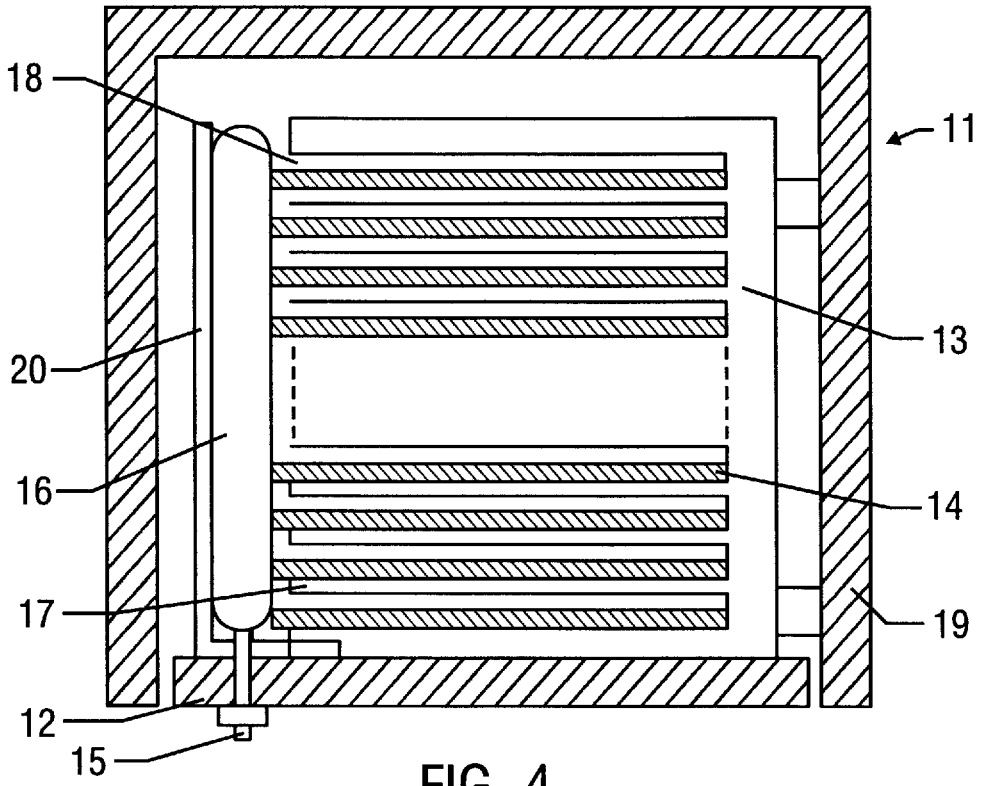
FIG. 4. An apparatus with an inflatable tube attached to a door with a valve extending through the door, as applied to a pod with a bottom door.

FIG. 4 demonstrates an embodiment in which the door 12 of the pod 11 is in positioned in a wall 19 of the box 12 such that the door 12 is parallel to the stacked wafers 14 contained in the cassette 13. This embodiment has an inflatable tube 16 attached to the door 12 by a mounting bracket 20 such that the tube 16 extends in a perpendicular direction with respect to the door 12. A valve 15 extends from the interior cavity 21 of the tube 16 and passes through the door 12, so that when the tube 16 is in the deflated state, the tube 16, valve 15 and bracket 20 are lowered as a single unit with the door 12. When the door 12 is closed, the tube 16 is in a position to contact the edge of the wafers 14 when inflated. The bracket 20 is constructed of a rigid material so that the tube 16 is pressed firmly against the wafers 14 when inflated.

Figure 5:
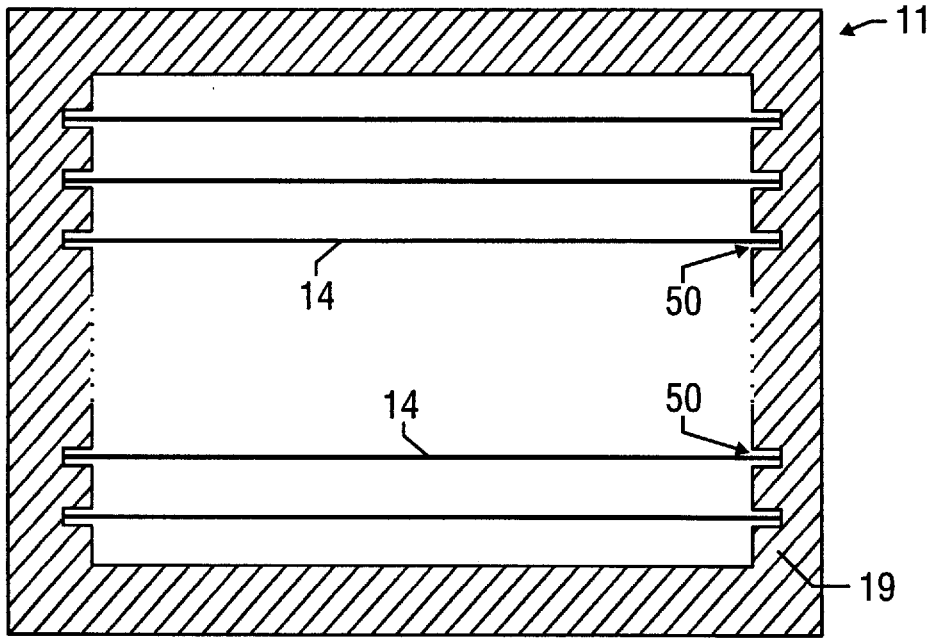
FIG. 5. An apparatus having slotted member integrally formed into the sides of a pod.

FIG. 5 depicts yet another embodiment of the present invention. FIG. 5 depicts a view of the box or pod 11 through the opening of the pod 11. As shown in FIG. 5, an alternative embodiment of the present invention may be integrally built into the side 19 of the pod 11 the slots 50 which hold the wafers 14. Thus, the present invention may be utilized in a box or pod 11 in which a separate slotted cassette is not inserted but rather the slots are built into the sides 19 of the pod 11. In such an embodiment as shown as FIG. 5, a tube or other similar pliant member may then be used in the manner described above to dampen the movement of the wafers 14 within the pod 11.

Although the present drawings demonstrate embodiments of the invention designed to be used with a standardized mechanical interface (SMIF) system, it is understood that the invention may also be used with other types of clean room environment transportation and storage systems. For example, the present invention will be useful in the transport or storage in a clean room environment of any type of substrate in a cassette or boat contained in a box. Thus, as used herein the term pod may be construed to mean either a box, a SMIF pod, or other container. The present invention is contemplated to be particularly useful in a clean room manufacturing environment, and in those which deal with automated substrate transport and handling systems. The invention offers several advantages over the current methods, including those that use rigid retainer bars. For example, the flexibility of the tube of the present invention conforms to dimensional variations of wafers and cassettes to assure that all wafers are in touch with the tube. Further, wafers are prevented from movement in any direction, and the engagement between the tube and the wafers during pressurization and depressurization is smooth and free of hard contacts. Finally, the retention force can be adjusted by the air pressure to accommodate different types of cassettes, wafers and transport systems.

The apparatus of the present invention may be further defined wherein the slotted holder is a cassette or boat for holding semiconductor wafers, and as comprising a box or a pod containing the slotted holder. The box or pod may also comprise a movable door or lid, having an external surface and an internal surface and the flexible tube may be attached to the internal surface of the door or lid. In this embodiment, the flexible tube may preferably be an inflatable tube, and may further comprise a valve attached to the external surface of the door. The valve passing through the door, into the interior cavity of the tube, to form a passage from the interior of the tube through the valve, operable to vent the interior of the tube to the external environment.

In certain embodiments, the present invention may be described as part of an apparatus for containing a plurality of semiconductor wafers, the apparatus including: (a) a cassette having a plurality of slots, tracks, ridges or grooves, positioned to hold a plurality of semiconductor wafers in a parallel, stacked configuration; (b) a box having a bottom, sides and a door, and designed to contain one or more of the cassettes; and (c) a flexible tube attached inside the box in a position to contact the semiconductor wafers when the cassette holding the wafers is contained in the box, and provide vibrational damping. In this embodiment, the tube may be an inflatable tube and may further comprise a duct or other conduit extending through one of the walls of the box, and provide fluid communication between the internal cavity of the inflatable tube and the outside of the box; and wherein the duct is provided with a valve, operable to control the inflation and deflation of the inflatable tube. The tube may also be attached to the door, and the duct may then extend through the door.

The present invention may also be described as a method for transporting substrates in a clean environment comprising the steps of holding the substrates in a slotted cassette and preventing vibrational damage in the substrates by contacting the substrates with a flexible tube to prevent motion in a direction parallel or perpendicular to the plane of said substrates. The flexible tube may preferably be an inflatable tube.

While the apparatus and methods of this invention have been described in terms of preferred embodiments, it will be apparent to those of skill in the art that variations may be applied to the apparatus and methods described herein without departing from the concept, spirit and scope of the invention. All such similar substitutes and modifications apparent to those skilled in the art are deemed to be within the spirit, scope and concept of the invention as defined by the appended claims.

What is claim is:

1. Apparatus for holding a plurality of semiconductor wafers having edges to be transported in a clean room environment comprising:

a holder for holding said plurality of semiconductor wafers; and an elastically deformable member having a conforming surface which deforms upon contact with said edges to form bulges in said surface around the edges of said semiconductor wafers to dampen movement of said semiconductor wafers.

2. Apparatus of claim 1, wherein said elastically deformable member comprises an inflatable tube.

3. Apparatus of claim 2, wherein said tube is adapted to be inflated at atmospheric pressure and deflated by application of a vacuum.

4. Apparatus of claim 1, wherein said holder comprises a cassette for holding said semiconductor wafers.

5. Apparatus of claim 1, further comprising a pod containing said holder; wherein said pod comprises a removable door having an internal surface and said deformable member is attached to said internal surface of said door; and wherein said deformable member comprises an inflatable tube having an internal cavity, and said apparatus further comprises a valve passing through said door, into said internal cavity of said tube, said valve operable to vent the internal cavity of said tube.

6. Apparatus for containing a plurality of semiconductor wafers having edges, said apparatus comprising:

a) a cassette having a plurality of slots positioned to hold said semiconductor wafers in a parallel, stacked configuration;

b) a pod having a plurality of sides and a door, and designed to contain one or more of said cassettes; and c) a flexible tube attached inside said pod in a position to contact one or more said wafers, said tube having a surface deforming upon contact with said one or more wafers to form bulges around one or more said edges and to provide vibration damping to said plurality of semiconductor wafers when said cassette holding said wafers is contained in said pod.

7. Apparatus of claim 6, wherein said tube is an inflatable tube having an internal cavity.

8. Apparatus of claim 7, further comprising a valve extending through one of said sides, and providing fluid communication between said internal cavity of said inflatable tube and the outside of said box; and wherein said valve is operable to control inflation and deflation of said inflatable tube.

9. Apparatus of claim 7 further comprising a valve extending through said door, and providing fluid communication between said internal cavity of said inflatable tube and the outside of said box; and wherein said valve is operable to control inflation and deflation of said inflatable tube.

10. A method for transporting semiconductor wafers having edges in a clean room environment comprising:

holding said semiconductor wafers having edges in a slotted cassette; and dampening vibrational movement in said semiconductor wafers by contacting said semiconductor wafers with a pliant member having a surface deformable upon contact with said edges to conform and deform around said edges to prevent motion in directions parallel and perpendicular to the plane of said semiconductor wafers by means of bulges formed in said surface of said pliant member around the edges of said semiconductor wafers.

11. The method of claim 10, wherein said pliant member comprises an inflatable tube.

12. An apparatus for transporting a plurality of semiconductor wafers comprising:

a container holding an array of parallel slots adapted to receive a semiconductor wafer in each slot with an edge of each semiconductor wafer protruding from its slot, said container having an opening and including a closure member to close the opening, said container and opening adapted to receive said semiconductor wafers with a space between the edges of the semiconductor wafers and an opposing surface of the container; and an elastically deformable member interposed between said protruding edges and said opposing surface, said deformable member having a surface deformable upon contact with said edges to form bulges around said edges when the container is closed to restrain movement of said semiconductor wafers in said slots.

13. The apparatus of claim 12 wherein said elastically, deformable member comprises an inflatable member inflatable from outside said container.

14. The apparatus of claim 12 wherein said opening lies opposite said protruding edges, and said elastically deformable member is supported by said closure member.

15. Apparatus for transporting a plurality of semiconductor wafers in a clean room environment, comprising:

a slotted cassette adapted to hold a plurality of semiconductor wafers side-by-side in an array with edges of the semiconductor wafers protruding form the slots;

a box having enclosing surfaces and an opening in one of said enclosing surfaces;

said box adapted to receive said cassette through said opening with said edges facing an opposite enclosing surface and defining a space between said edges and said opposite enclosing surface;

said box including a closure member adapted to close said opening; and an elastically compliant member adapted to be positionable in the space between said edges and said opposite enclosing surface, said compliant member having a conforming surface adapted to contact and correspondingly form bulges around said edges when said opening is closed to dampen movements of said semiconductor wafers in said slots.

16. The apparatus of claim 15 wherein said elastically compliant member comprises a plastic tube.

17. The apparatus of claim 16 wherein said compliant member is hollow and inflatable and said apparatus includes a conduit extending from said inflatable member.

18. The apparatus of claim 17 in which the container comprises a cassette.

19. A method of transporting in a clean room environment a slotted holder containing semiconductor wafers in the slots of the holder which comprises:

enclosing the holder and semiconductor wafers in a pod having enclosing surfaces with edges of the semiconductor wafers protruding from the slots in spaced relation with an opposite enclosing surface of the pod to define a space between the opposite enclosing surface and the edges; and contacting the protruding edges from within said space with a member having a pliant surface such that said pliant surface deforms to form bulges around said edges to dampen movements of the semiconductor wafers within the slots.

20. An apparatus for restraining a plurality of semiconductor wafers having edges comprising:

a holder for holding said semiconductor wafers; and a soft elastomeric restraining member adapted to conform and deform around edges of a plurality of semiconductor wafers upon contact with said edges and to return to an original shape when removed from said edges.

21. Apparatus of claim 20, wherein said member conforms to dimensional variations of said edges of said plurality semiconductor wafers.

* * * * *